United States Patent
Fujii et al.

(10) Patent No.: US 6,591,491 B2
(45) Date of Patent: Jul. 15, 2003

(54) METHOD FOR PRODUCING MULTILAYER CIRCUIT BOARD

(75) Inventors: Hirofumi Fujii, Ibaraki (JP); Satoshi Tanigawa, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/799,684

(22) Filed: Mar. 7, 2001

(65) Prior Publication Data

US 2001/0023532 A1 Sep. 27, 2001

(30) Foreign Application Priority Data

Mar. 22, 2000 (JP) ........................... 2000-080145

(51) Int. Cl.⁷ .................................. H05K 3/36
(52) U.S. Cl. ..................... 29/830; 29/852; 29/846; 29/825; 174/262; 174/265
(58) Field of Search ................... 29/830, 852, 847, 29/846, 825, 831, 832; 427/97, 98; 174/267, 266, 265, 262

(56) References Cited

U.S. PATENT DOCUMENTS

| | | | | |
|---|---|---|---|---|
| 3,932,932 A | * | 1/1976 | Goodman | 29/625 |
| 4,875,283 A | * | 10/1989 | Johnston | 29/830 |
| 4,915,983 A | * | 4/1990 | Lake et al. | 427/98 |
| 5,046,238 A | * | 9/1991 | Daigle et al. | 3/36 |
| 5,308,929 A | * | 5/1994 | Tani et al. | 174/262 |
| 6,240,636 B1 | * | 6/2001 | Asai et al. | 29/852 |
| ,023,532 A1 | * | 9/2001 | Fujii et al. | 29/830 |
| 6,286,204 B1 | * | 9/2001 | Sreeram et al. | 29/825 |
| 2002/0108781 A1 | * | 8/2002 | Mune et al. | 174/264 |

FOREIGN PATENT DOCUMENTS

| | | | | |
|---|---|---|---|---|
| DE | 19910482 A1 | * | 5/2000 | |
| JP | 5-160573 | * | 6/1993 | 29/846 |
| JP | 6-29355 | * | 2/1994 | |
| JP | 6-77650 | * | 3/1994 | |
| JP | 10-70365 | * | 3/1994 | |
| JP | 9-186454 | | 7/1997 | |
| JP | 2001-85842 | * | 3/2001 | |

* cited by examiner

*Primary Examiner*—Peter Vo
*Assistant Examiner*—Minh Trinh
(74) *Attorney, Agent, or Firm*—Kubovcik & Kubovcik

(57) ABSTRACT

A producing method of a multilayer circuit board for ensuring that a circuit board, such as an interposer, is provided on the multilayer circuit board. The method includes the steps forming the interposer on a support board; forming a multilayer circuit board separately from the interposer; joining the interposer formed on the support board to the multilayer circuit board; and then removing the support board. According to this method, even if the production of the interposer fails after the production of the multilayer circuit board, it is possible to scrap the interposer only and there is no need to scrap it together with the multilayer circuit board. Besides, although the interposer is thin and limp, since it is formed on the support board, the interposer can surely and readily be joined to the multilayer circuit board.

2 Claims, 13 Drawing Sheets

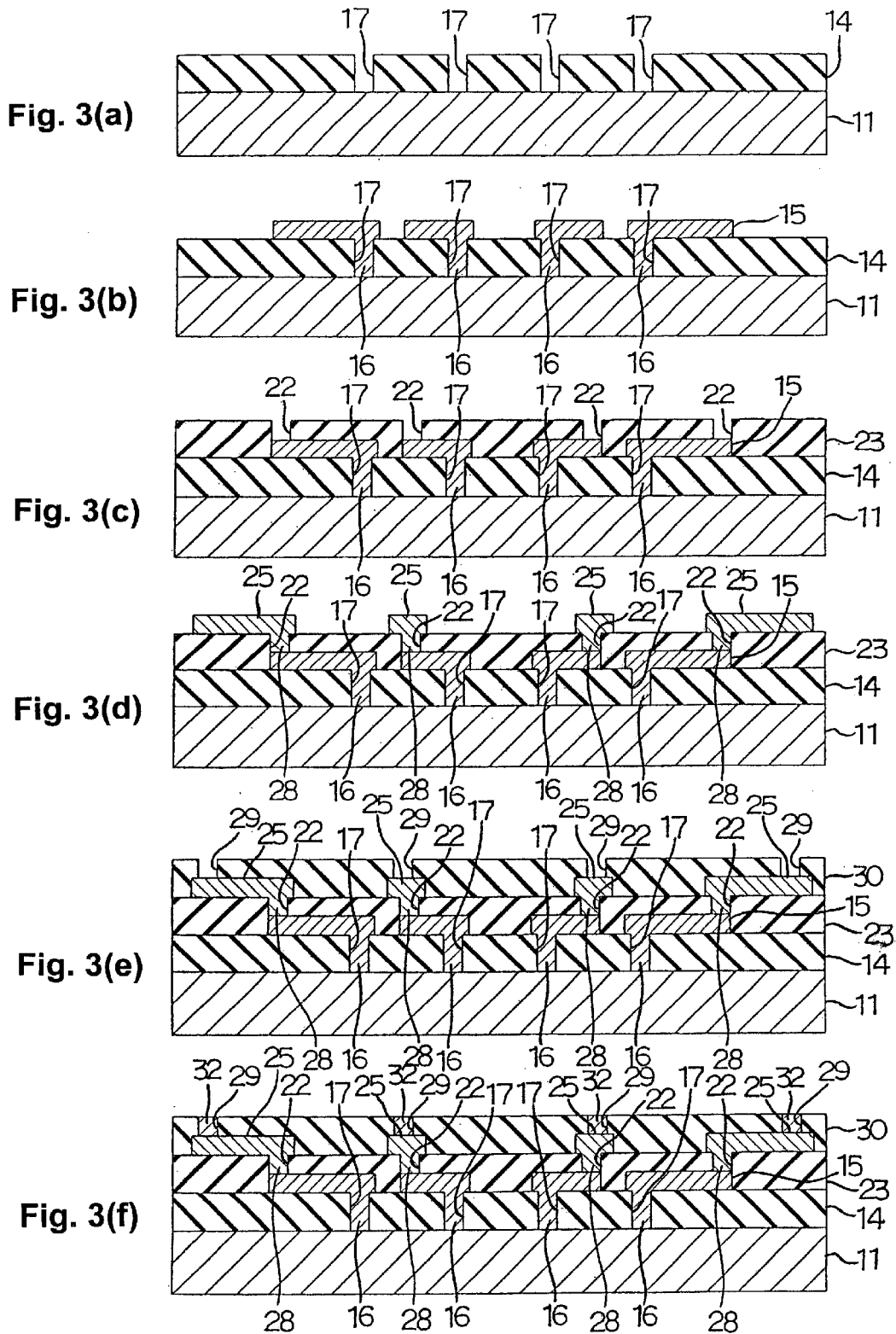

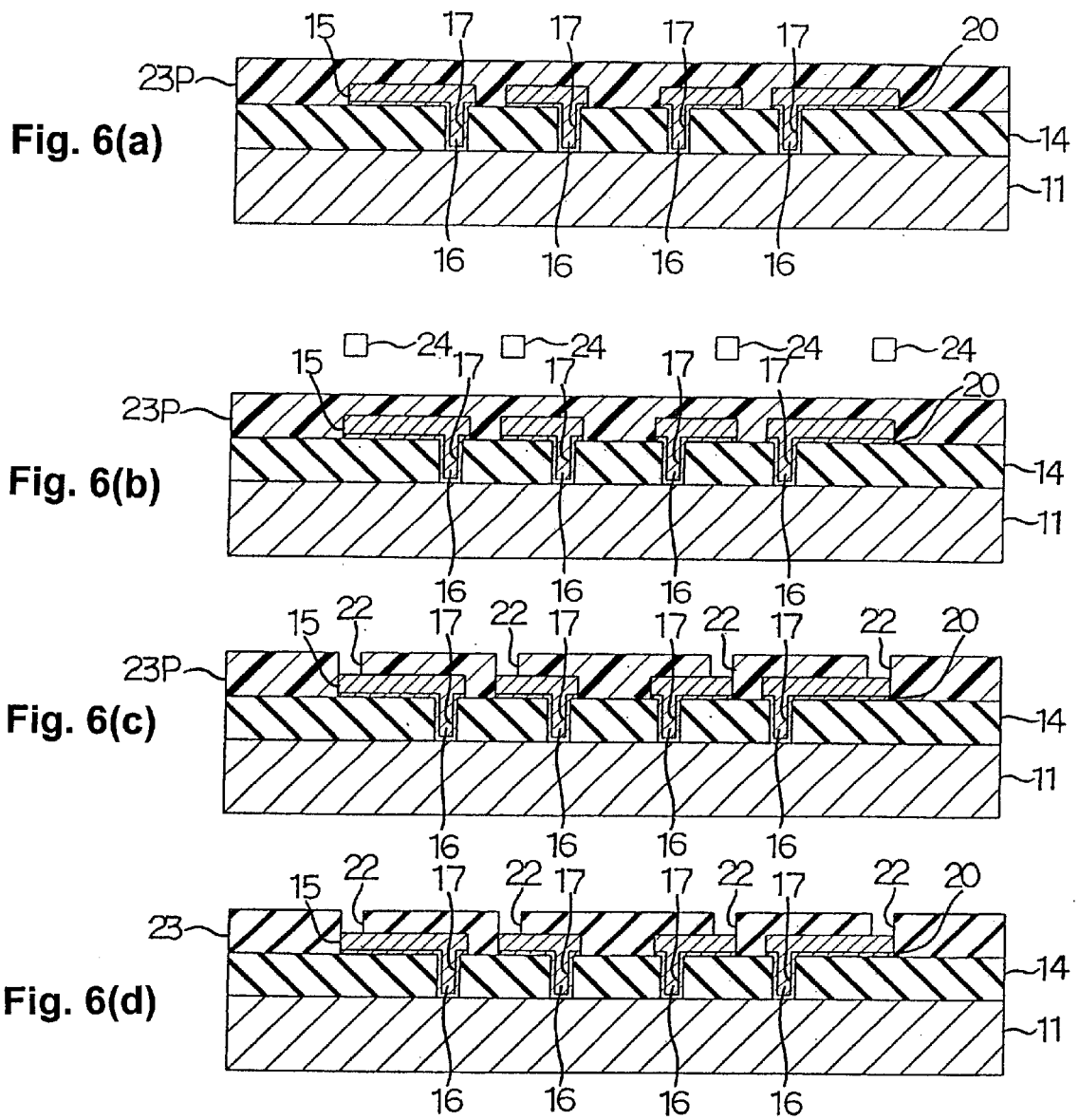

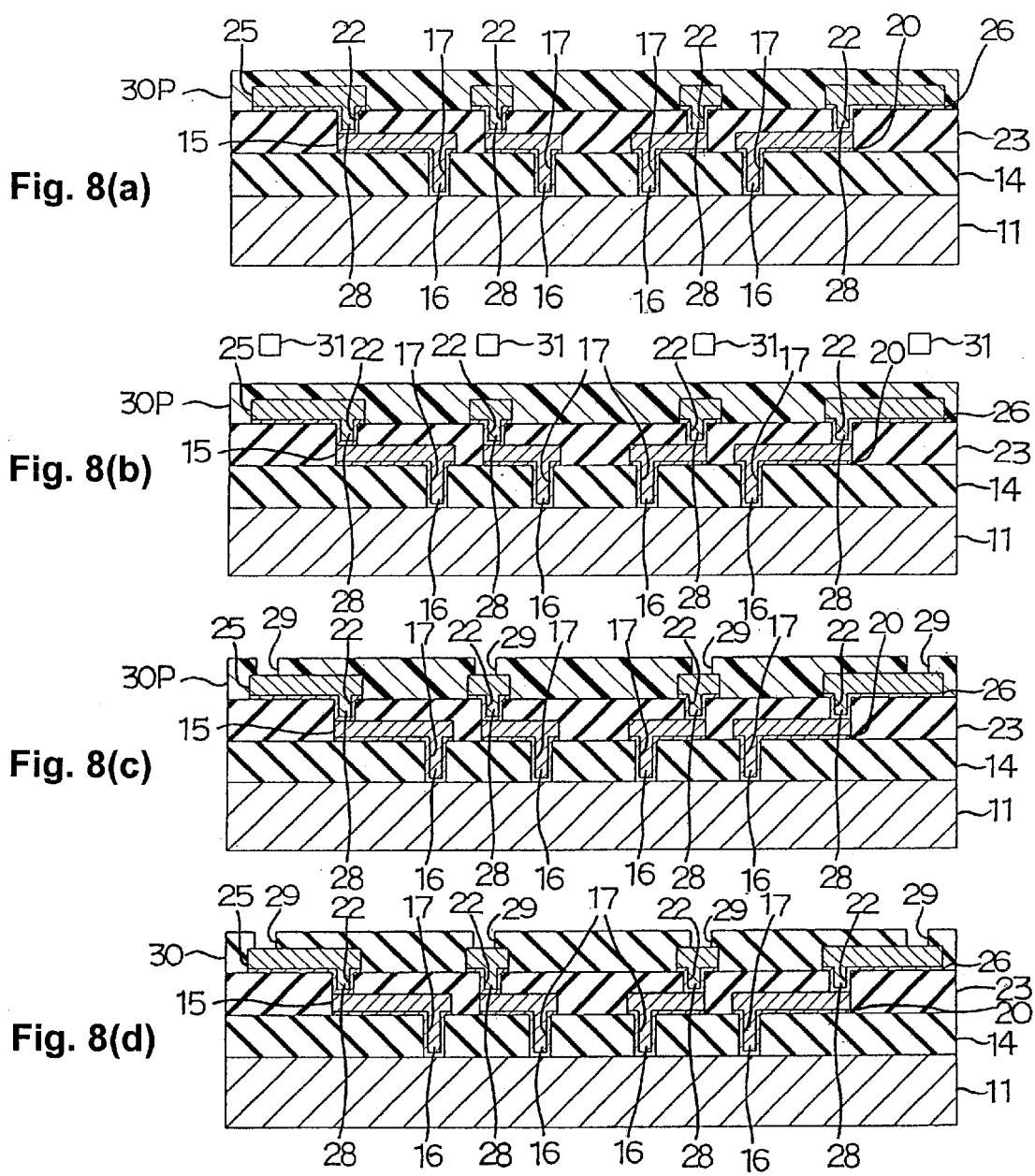

METHOD FOR PRODUCING MULTILAYER CIRCUIT BOARD

BACKGROUND OF THE INVENTION

1. Field of the Invention

This invention relates to a method for producing a multilayer circuit board and, more particularly, to a method for producing a multilayer circuit board with an interposer used for a chip-size package.

2. Description of the Prior Art

In recent years, as the demand for the circuit board to have increasingly higher density and finer pitch increases, three-dimensionally wired multilayer circuit boards have been increasingly used. The multilayer circuit board has semiconductor devices mounted thereon. The multiplayer circuit board usually has terminals larger in pitch than the terminals of the semiconductor devices. Due to this, as shown in FIG. 13, an interposer 3, which has on one side thereof terminals 5 formed with pitches corresponding to the terminals 4 of the semiconductor device 1 and has on the other side thereof terminals 7 formed with pitches corresponding to the terminals 6 of the multilayer circuit board 2, is interposed between the semiconductor device 1 and the multilayer circuit board 2, so that the terminals 4 of the semiconductor device 1 and the terminals 6 of the multilayer circuit board 2 are electrically connected through the interposer 3.

It is known that such a multilayer circuit board 2 with the interposer 3 is produced, for example, by the method that insulating layers 2a and conductive layers 2b formed in the form of a predetermined circuit pattern are laminated alternately and also the conductive layers 2b are allowed to conduct through inner via holes 2c to thereby produce the multilayer circuit board 2 in the known manner, and then insulating layers 3a and conductive layers 3b formed in the form of a predetermined circuit pattern are laminated alternately on the multilayer circuit board 2 thus produced and also the conductive layers 3b are allowed to conduct through inner via holes 3c to thereby produce the interposer 3 in the known manner.

However, with this producing method of the multilayer circuit board 2 with the interposer 3, if the production of the interposer 3 fails after the production of the multilayer circuit board 2, not only the interposer 3 but also the multilayer circuit board 2 must be scrapped, thus suffering a considerable loss in the manufacturing process.

It may be conceivable that the multilayer circuit board 2 and the interposer 3 are produced separately, first, and then are joined together, but since the interposer 3 is so thin and limp that it is hard for the both to be aligned with and joined to each other with accuracy.

It is the object of the invention to provide a producing method of a multilayer circuit board for ensuring that a circuit board, such as an interposer, is provided on the multilayer circuit board.

SUMMARY OF THE INVENTION

The present invention is directed to a novel method for producing a multilayer circuit board comprising the step of forming a circuit board on a support board; the step of forming a multilayer circuit board separately from the circuit board; the step of joining the circuit board formed on the support board to the multilayer circuit board; and the step of removing the support board.

According to this producing method, the circuit board and the multilayer circuit board can be allowed to be produced separately. Hence, even if the production of the circuit board fails after the production of the multilayer circuit board, it is possible to scrap the circuit board only and there is no need to scrap it together with the multilayer circuit board, differently from the conventional method. Thus, losses in the manufacturing process can be reduced, thus achieving saving of material resources and reduction of manufacturing costs.

Besides, although the circuit board is so thin and limp, since it is formed on the support board, the reliable and easy joining can be effected. Hence, according to this method, the circuit board can surely be jointed to the multilayer circuit board.

In addition, according to this producing method, since the support board serves to prevent contraction of the resin of the insulating layers in the manufacturing process of the circuit board, the displacement between the layers can well be prevented. Hence, the circuit board can be produced with fine pitches with accuracy, as compared with the conventional method that after the multilayer circuit board is produced, the circuit board is produced directly on it.

Further, according to this producing method, since the support board enables the surface of the insulating layer, which was in contact with the support board of the circuit board, to smoothly be formed, improved reliability for connection with an external circuit board can be provided.

According to the present invention, it is preferable that the circuit board formed on the support board has a multitiered structure. Preferably, the circuit board formed on the support board is an interposer for electrically connecting between a semiconductor device and the multilayer circuit board.

BRIEF DESCRIPTION OF THE DRAWINGS

In the drawings:

FIG. 3 is a process drawing illustrating the steps for forming the interposer on the support board in FIG. 1(a), wherein:
(a) is a sectional view illustrating the step of forming a first insulating layer with first via holes;
(b) is a sectional view illustrating the step of forming a first conductive layer;
(c) is a sectional view illustrating the step of forming a second insulating layer with second via holes;
(d) is a sectional view illustrating the step of forming a second conductive layer;
(e) is a sectional view illustrating the step of forming a third insulating layer with third via holes; and
(f) is a sectional view illustrating the step of forming terminals in the third via holes;

FIG. 4 is a process drawing illustrating the steps for forming the first insulating layer with the first via holes on the support board in FIG. 3(a), wherein:

Figures 1A, 1B, 1C:
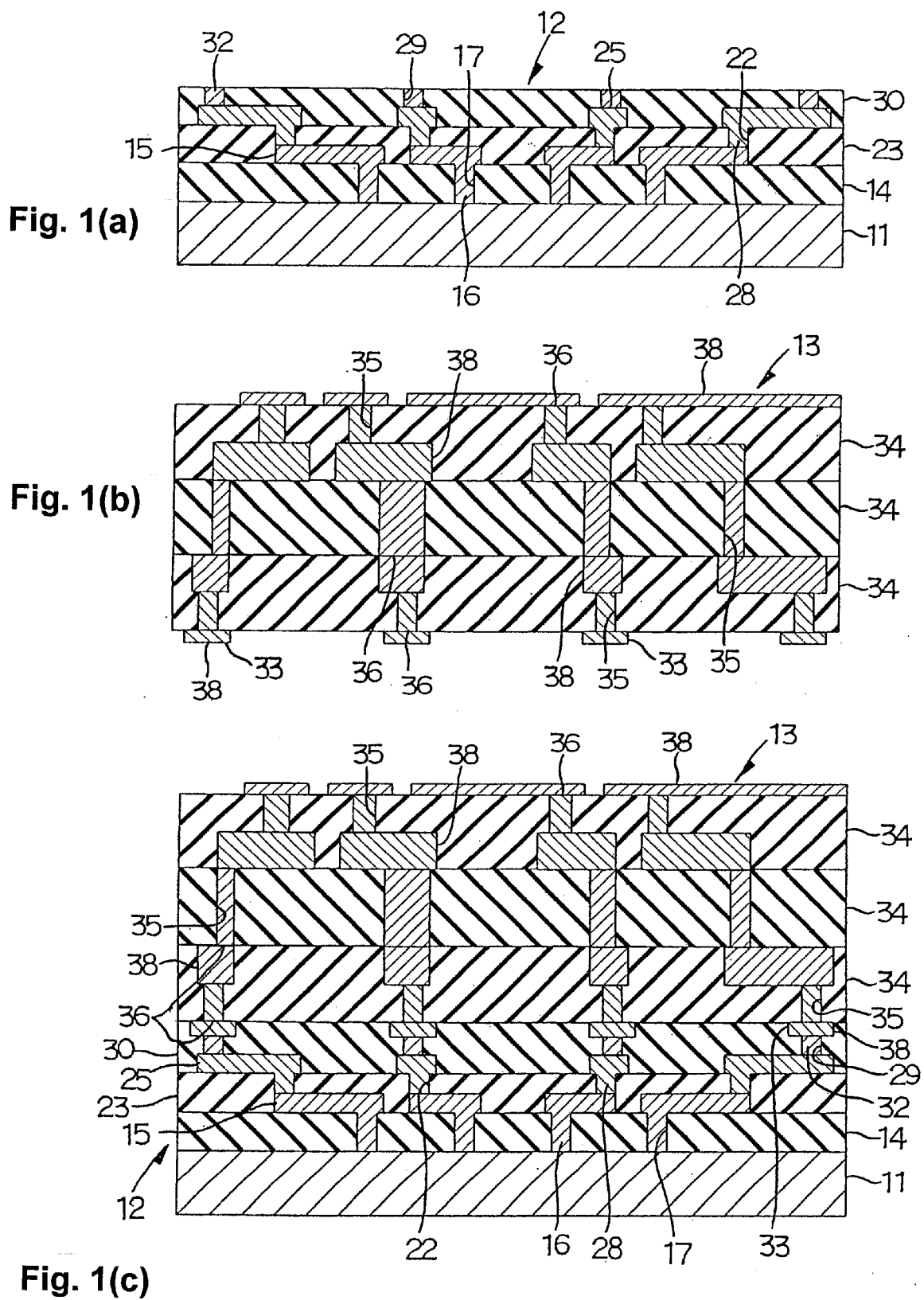
FIG. 1 is a process drawing showing an embodiment of a producing method of a multilayer circuit board of the present invention, wherein:
(a) is a sectional view illustrating the step of forming an interposer on a support board;
(b) is a sectional view illustrating the step of forming a multilayer circuit board; and
(c) is a sectional view illustrating the step of joining the multilayer circuit board to the interposer.
Figure 9A:
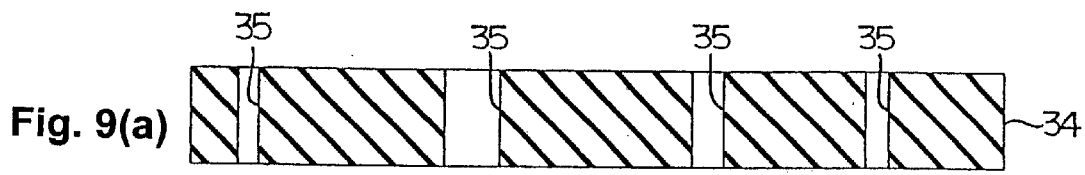
Figure 9B:
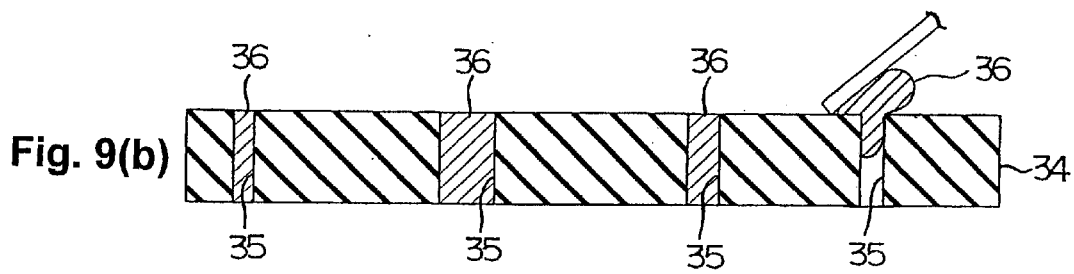
Figure 13:
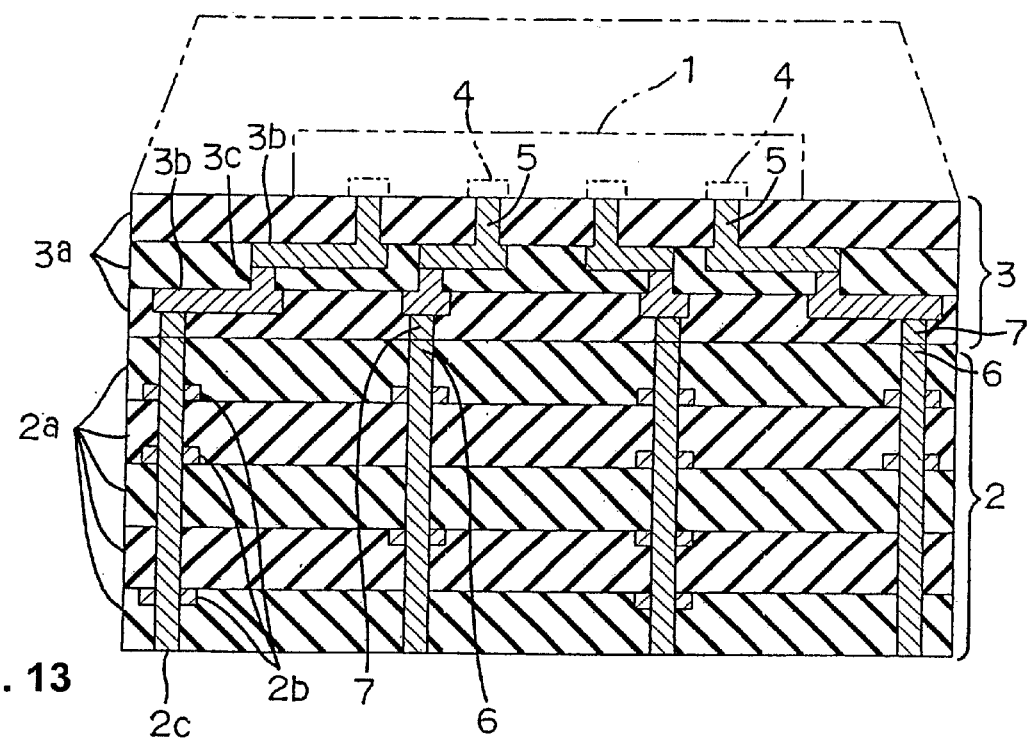

(a) is a sectional view illustrating the step of forming a polyamic acid resin layer on the support board;

(b) is a sectional view illustrating the step of exposing the polyamic acid resin layer to light through a photomask;

(c) is a sectional view illustrating the step of forming the first via holes in the polyamic acid resin layer by a developing procedure; and (d) is a sectional view illustrating the step of forming the first insulating layer of polyimide by curing the polyamic acid resin layer, FIG. 5 is a process drawing illustrating the steps for forming the first conductive layer in FIG. 3(b), wherein:

(a) is a sectional view illustrating the step of forming a ground on the entire surface of the first insulating layer and side walls and a bottom wall in each of the first via holes;

(b) is a sectional view illustrating the step of forming a plating resist on the ground in all area thereof except the area where the specified circuit pattern is formed;

(c) is a sectional view illustrating the step of forming first conducting passages in the first via holes and forming the first conductive layer with the specified circuit pattern on the first insulating layer;

(d) is a sectional view illustrating the step of removing the plating resist; and (e) is a sectional view illustrating the step of removing the ground on which the plating resist was formed, FIG. 6 is a process drawing illustrating the steps for forming the second insulating layer with the second via holes in FIG. 3(c), wherein:

(a) is a sectional view illustrating the step of forming the polyamic acid resin layer on the first conductive layer;

(b) is a sectional view illustrating the step of exposing the polyamic acid resin layer to light through the photomask;

(c) is a sectional view illustrating the step of forming the second via holes in the polyamic acid resin layer by the developing procedure; and (d) is a sectional view illustrating the step of forming the second insulating layer of polyimide by curing the polyamic acid resin layer, FIG. 7 is a process drawing illustrating the steps for forming the second conductive layer in FIG. 3(d), wherein:

(a) is a sectional view illustrating the step of forming the ground on the entire surface of the second insulating layer and side walls and a bottom wall in each of the second via holes;

(b) is a sectional view illustrating the step of forming the plating resist on the ground in all area thereof except the area where the specified circuit pattern is formed;

(c) is a sectional view illustrating the step of forming second conducting passages in the second via holes and forming the second conductive layer with the specified circuit pattern on the second insulating layer;

(d) is a sectional view illustrating the step of removing the plating resist; and (e) is a sectional view illustrating the step of removing the ground on which the plating resist was formed, FIG. 8 is a process drawing illustrating the steps for forming the third insulating layer with the third via holes in FIG. 3(e), wherein:

(a) is a sectional view illustrating the step of forming the polyamic acid resin layer on the second conductive layer;

(b) is a sectional view illustrating the step of exposing the polyamic acid resin layer to light through the photomask;

(c) is a sectional view illustrating the step of forming the third via holes in the polyamic acid resin layer by the developing procedure; and (d) is a sectional view illustrating the step of forming the third insulating layer of polyimide by curing the polyamic acid resin layer, FIG. 9 is a process drawing illustrating the steps for forming the multilayer circuit board in FIG. 1(b), wherein:

(a) is a sectional view illustrating the step of preparing an insulation board of a prepreg and forming the via holes therein;

(b) is a sectional view illustrating the step of filling conductive paste into the via holes;

(c) is a sectional view illustrating the step of arranging metal foils on both sides of the insulation board and heating and pressurizing them; and (d) is a sectional view illustrating the step of forming the metal foils in the form of the specified circuit pattern, FIG. 10 is a process drawing illustrating the steps for forming the multilayer circuit board in FIG. 1(b), wherein:

(e) is a sectional view illustrating the step of arranging, on each side of the both-side wiring board used as the core, the insulation board of prepreg as was formed in the step of FIG. 9(b) which has the via holes filled with the conductive paste; forming the metal foils on both outer sides of the insulation boards of the prepreg, respectively; and heating and pressurizing them, and;

(f) is a sectional view illustrating the step of forming the external metal foils in the form of the specified circuit pattern, FIG. 11 is a process drawing showing another embodiment of the producing method of the multilayer circuit board of the present invention, wherein:

(a) is a sectional view illustrating the step of forming a multilayer circuit board of another embodiment; and (b) is a sectional view illustrating the step of joining the multilayer circuit board to the interposer, FIG. 12 is a process drawing showing another embodiment of the producing method of multilayer circuit board of the present invention, wherein:

(c) is a sectional view illustrating the step of removing the support board; and (d) is a sectional view illustrating the step of mounting a semiconductor device chip on the interposer, FIG. 13 is a sectional view of a conventional type of multilayer circuit board with the interposer.

DETAILED DESCRIPTION OF THE PREFERRED EMBODIMENTS

The method for producing the circuit board of the present invention will be described in detail, taking a method for producing a multilayer circuit board with an interposer used for a chip-size package as an example.

In this method, an interposer 12 as a circuit board is first formed on a support board 11, as shown in FIG. 1(a).

The steps for forming the interposer 12 on the support board 11 are illustrated in FIG. 3. Referring now to FIG. 3, the steps for forming the interposer 12 on the support board 11 will be described in detail. It is noted that in FIG. 3, a ground that would be formed by a semi-additive process in forming a conductive layer as will be mentioned later is omitted.

In order for the interposer 12 to be formed on the support board 11, the support board 11 is prepared first and then a first insulating layer 14 having first via holes 17 is laminated on the support board 11, as shown in FIG. 3(a). The support board 11 serves to impart rigidity to the interposer 12 laminated on it, so as to provide improved workability in joining to a multilayer circuit board 13 as mentioned later. It can also serve to hinder the heat shrinkage when the insulating layer is formed by coating resin on the support board 11 and then curing it. Further, it can be used as a cathode of an electrolysis plating when a first conductive layer 15 and a first conducting passage 16 are formed by using the electrolysis plating.

Since this support board 11 needs certain degree of rigidity, a metal film is preferably used therefor. Among others, 42 alloy stainless-steel is preferably used in terms of stiffness (nerve), lowness in coefficient of linear expansion, readiness for removal, and applicability as the cathode of the electrolysis plating. Though thickness of the support board 11 is not limited to any particular thickness, it preferably has thickness of about 10 to about 100 $\mu$m, for example.

Any insulating material may be used for the first insulating layer 14 without any particular limitation, as long as it has insulating properties. The first insulating layer 14 may be formed, for example, by using any known resin used for the insulating material of the circuit board. The insulating material which may be used include, for example, polyimide resin, polyether sulfonic resin, polyether nitrile resin, polyethylene terephthalate resin, polyethylene naphthalate resin and polyvinyl chloride resin. Though thickness of the first insulating layer 14 is not limited to any particular thickness, it preferably has thickness of about 5 to about 50 $\mu$m, for example.

Of these resins, photosensitive resin, such as photosensitive polyimide resin or photosensitive polyether sulfonic resin, is preferably used to form the first insulating layer 14. The use of the photosensitive resin enables the first insulating layer 14 and the first via holes 17 to be formed simultaneously.

Figure 4A:
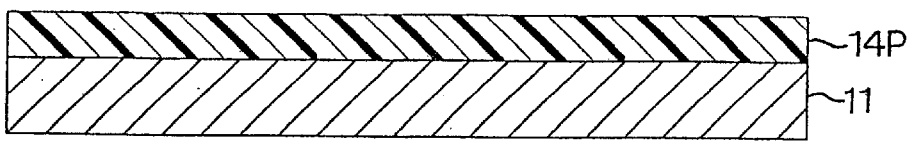

For example, when the first insulating layer 14 is formed by using the photosensitive polyimide resin, a resin layer 14P of photosensitive polyamic acid (polyamide acid) resin of the precursor of polyimide resin is formed on the support board 11, first, as shown in FIG. 4(a). The photosensitive polyamic acid resin is produced by photosensitizer being mixed in polyamic acid resin obtained by allowing acid dianhydride to react with diamine.

Acid dianhydrides which may preferably be used include, for example, 3, 3', 4, 4'-oxydiphthalic acid dianhydride (ODPA), 3, 3', 4, 4'-biphenyl tetracarboxylic acid dianhydride, pyromellitic acid dianhydride, 2, 2-bis (3, 4-dicarboxyphenyl) hexafluoropropane dianhydride (6FDA), and 3, 3', 4, 4'-benzophenone tetracarboxylic acid dianhydride (BTDA). Diamines which may preferably be used include, for example, p-phenylene diamine (PPD), 1, 3-bis (3-aminophenoxy) benzene, bisamino propyl tetramethyldisiloxane (APDS), and 4, 4'-diamino diphenyl ether (DDE).

Polyamic acid resin can be obtained in the form of liquid solution of polyamic acid resin by allowing acid dianhydride and diamine to react with each other in appropriate organic solvent, such as N-methyl-2-pyrrolidone, N, N-dimethylacetamide and N, N-dimethylformamide, in such a proportion that will become a substantially equal mole ratio under normal temperature and pressure for a specified time.

The photosensitizers to be mixed in polyamic acid resin which may preferably be used include, for example, 1, 4-dihydropyridine derivative. 1-Ethyl-3,5-dimethoxycarbonyl-4-(2-nitrophenyl)-1,4-dihydropyridine is particularly preferable.

The photosensitizer is usually mixed in the ratio of 0.1 to 1.0 mol to the total of acid dianhydride and the diamine or per mol of polyamic acid. With the mixture of a more than 1.0 mol of photosensitizer, the physicality of the first insulating layer 14 after cured may deteriorate. On the other hand, with the mixture of a less than 0.1 mol of photosensitizer, the formability of the first via holes 17 may reduce. Epoxy resin, bisallylic imide, maleimide, etc. may further be mixed in the photosensitive polyamic acid resin thus obtained, if necessary. Preferably, the photosensitive polyamic acid resin has the glass transition temperature (Tg) after imidized of preferably 250° C. or more, or further preferably 300° C. or more.

Then, the photosensitive polyamic acid resin thus obtained is, for example, applied on the support board 11 with a specified thickness and then dried by a known method or it is formed in advance in the form of a dry film of a specified thickness and then the dry film is joined to the support board 11, whereby the polyamic acid resin layer 14P that is formed as the first insulating layer is formed on the support board 11.

Subsequently, the polyamic acid resin layer 14P thus formed is exposed to light through a photomask. If required, the exposed part is heated to a certain temperature. Thereafter, the polyamic acid resin layer is developed to form the first via holes 17. Any radiation irradiated through the photomask may be used, including, for example, ultraviolet rays, electron rays and microwave, so long as it is the light that permits the photosensitive polyamic acid resin to be photosensitized. When the exposed part of the polyamic acid resin layer 14P irradiated is heated, for example, at not less than 130° C. to less than 150° C., it is solubilized (positive type) in the next developing procedure, while on the other hand, when heated, for example, at not less than 150° C. to not more than 180° C., it is not solubilized (negative type) in the next developing procedure. The development can be performed by any known method, such as a dipping process and a spraying process, using a known developing solution such as alkaline developer.

Figure 4B:
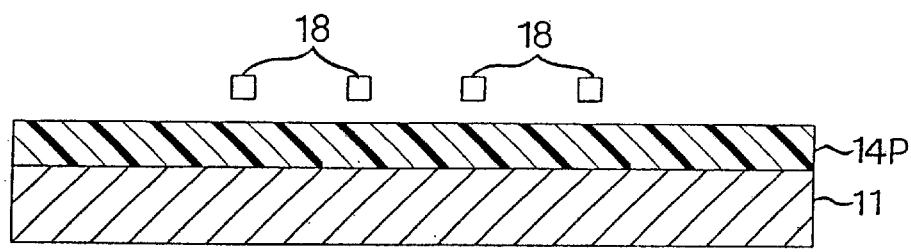
Figure 4C:
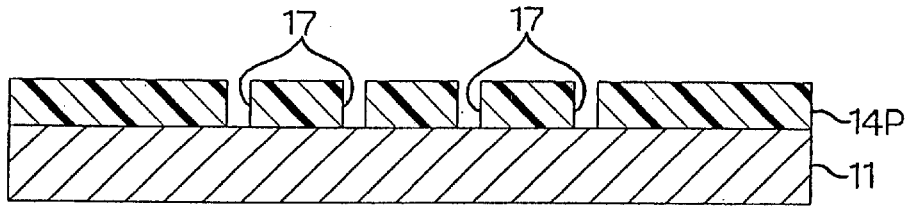

Thus, the first via holes 17 can be formed in a positive type or negative type pattern through a series of exposing-to-light, heating and developing procedures. Among others, the first via holes 17 are preferably formed in the negative type pattern. Illustrated in FIGS. 4(b) and 4(c) is an example of the way of forming the first via holes 17 in the negative type pattern. Specifically, as shown in FIG. 4(b), the photomask 18 is set in position over the polyamic acid resin layer 14P to confront terminals 40 of a semiconductor chip 19 (See FIG. 2), first, and then the polyamic acid resin layer 14P is irradiated with irradiated radiation through the photomask 18. Then, it is heated at a specified temperature to form the negative type pattern and then is developed through the specified developing procedure, as mentioned above. As a result of this, as shown in FIG. 4(c), the unexposed part of the polyamic acid resin layer 14P or the parts masked by the photomask 18 is dissolved in the developing solution to thereby form the first via holes 17.

Figure 4D:
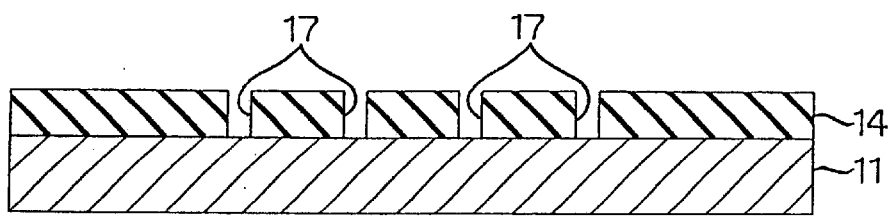

Then, as shown in FIG. 4(d), the polyamic acid resin layer 14P having the first via holes 17 formed therein is finally heated, for example, to 250° C. or more to be cured (imidized) and thereby the first insulating layer 14 of polyimide is formed.

In the case where the photosensitive resin is not used, though not shown, a coat of resin is applied to the support board 11 or is formed in advance in the form of dry film and then joined to the support board 11, to thereby produce the first insulating layer 14. Thereafter, it can be bored in a known perforating process using laser or plasma, to form the first via holes 17. Alternatively, the dry film of the first insulating layer 14 in which the first via holes 17 were formed in advance may be joined on the support board 11.

The process wherein the forming of the first insulating layer 14 and the first via holes 17 are simultaneously accomplished by using the photosensitive resin can provide the advantage of enabling a large number of first via holes 17 to be formed with fine pitches at one time, as compared with the process wherein after the first insulating layer 14 is formed, the first via holes 17 are formed therein via the laser perforating process and the like. Thus, the former process has the advantages of considerable increased speed (reduction of hours of work) and reduced costs resulting from improved workability and efficient production.

Sequentially, the first conductive layer 15 formed in a specified circuit pattern is formed on the first insulating layer 14 thus formed, as illustrated in FIG. 3(b).

Any conductive material may be used for the first conductive layer 15 without any particular limitation, as long as it has conducting properties. Known metals used as the conductive material of the circuit board may be used for the first conductive layer 15, including, for example, gold, silver, copper, platinum, lead, tin, nickel, cobalt, indium, rhodium, chromium, tungsten, and ruthenium, and further a variety of alloys thereof such as solder, nickel-tin, and gold-cobalt. Adequately, the first conductive layer 15 has thickness of e.g. around 5–20 $\mu$m, though not limited to any particular thickness.

The first conductive layer 15 may be formed in the specified circuit pattern on the first insulating layer 14 by using any known patterning process, such as a subtractive process, an additive process and a semi-additive process. In the subtractive process, the first conductive layer 15 is first laminated on the entire surface of the first insulating layer 14 and then an etching resist is formed on the first conductive layer 15 so as to match with the specified circuit pattern. With the etching resist as a resist, the first conductive layer 15 is etched and then the etching resist is removed from the first conductive layer 15. In the additive process, a plating resist is formed on the first insulating layer 14 at part thereof other than the part for the specified circuit pattern to be formed, first. Then, the first conductive layer 15 is formed by plating on the first insulating layer 14 at part thereof on which the plating resist is not formed. Thereafter, the plating resist is removed from the first insulating layer 14. Further, in the semi-additive process, a thin film of conductive material that is formed as a ground is formed on the first insulating layer 14, first, and then the plating resist is formed on the ground at part thereof other than the part for the specified circuit pattern to be formed. Then, the first conductive layer 15 is formed on the ground at part thereof on which the plating resist is not formed. Thereafter, the plating resist and the ground on which the plating resist was laminated are removed.

Figure 5A:
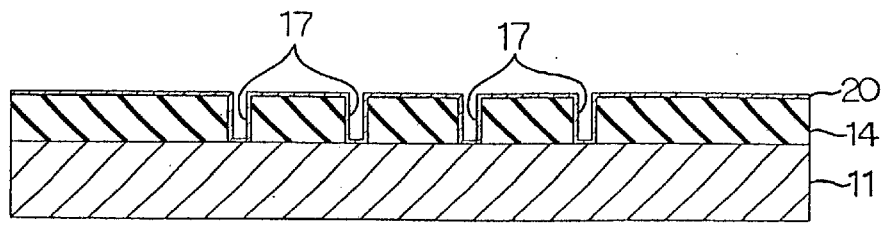

Of these processes, the semi-additive process is preferably used. In the following, the process for forming the first conductive layer 15 by using the semi-additive process will be described in detail. Referring to FIG. 5, there is shown the steps for forming the first conductive layer 15 by using the semi-additive process. As shown in FIG. 5(a), a thin film of conductive material that is to form a ground 20 is formed on the entire front surface of the first insulating layer 14 and the side walls and bottom wall in each of the first via holes 17, first. The ground 20 may be formed by use of a known vacuum deposition process, such as a sputtering deposition process, a resistive heating deposition process or an electron beam heating deposition process, or an electroless plating process. The sputtering deposition process is preferably used for forming the ground 20. Any conductive material may be used for the ground 20 without any particular limitation, as long as it can provide improved adhesion between the first insulating layer 14 and the first conductive layer 15. For example, for the first conductive layer 15 made of copper, chromium and copper is preferably used as the conductive material. While the thickness of the ground 20 is not limited to any particular thickness, it preferably has thickness of around 500–5,000 Å. The ground 20 may be formed not only in a single layer but also in a multilayer such as a two layer. For example, for a two layer ground 20 made of chromium and copper, the chromium layer preferably has thickness of 300–700 Å and the copper layer preferably has thickness of 1,000–3,000 Å.

Figure 5B:
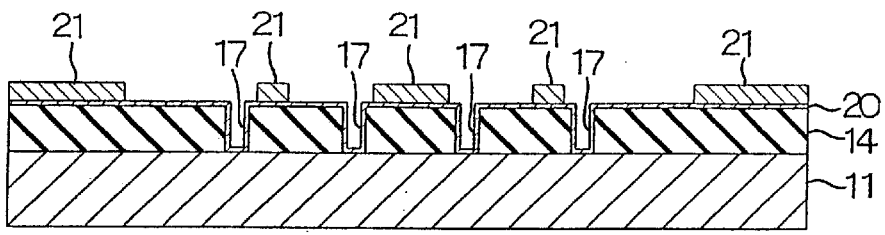
Figure 5C:
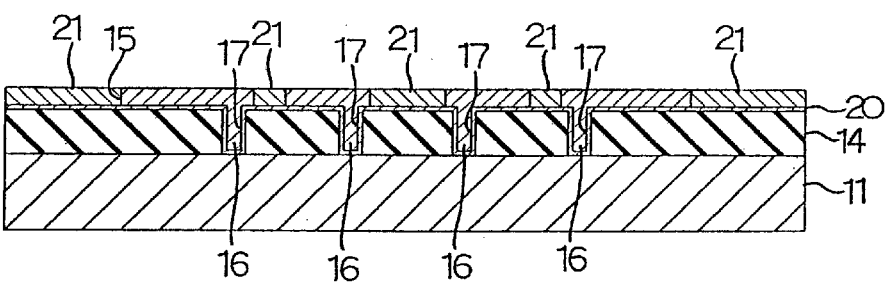

Sequentially, a plating resist 21 is formed on the ground 20 at part thereof other than the part for the specified circuit pattern to be formed, as shown in FIG. 5(b). The plating resist 21 can be formed in a specified resist pattern, for example, by using a dry film resist by a known process. Then, the first conductive layer 15 is formed on the first insulating layer 14 at the part thereof where no plating resist 21 is formed, by plating, as shown in FIG. 5(c). Though either of electrolysis plating and electroless plating may be used, the electrolysis plating is preferably used for forming the first conductive layer 15. When the first conductive layer 15 is formed by the electrolysis plating, it is preferable that with the support board 11 as the cathode, metal is deposited in the first via holes 17 to form the first conducting passages 16, first, and then the electrolysis plating continues, via which the metal is deposited on the first insulating layer 14 at part thereof where the plating resist 21 is not formed, so as to form the first conductive layer 15 in the specified circuit pattern. This electrolysis plating can effect the forming of the first conducting passages 16 in the first via holes 17 and the forming of the first conductive layer 15 in a single step. The metals which may preferably be used for the electrolysis plating include, for example, gold, copper, nickel and solder. Among others, copper is preferably used in terms of readiness of the forming of the circuit pattern and the electric properties.

Figure 5D:
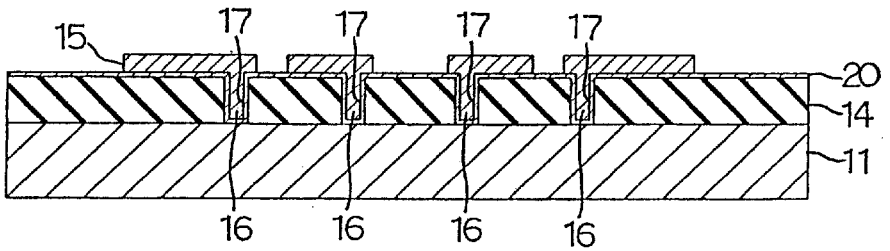
Figure 5E:
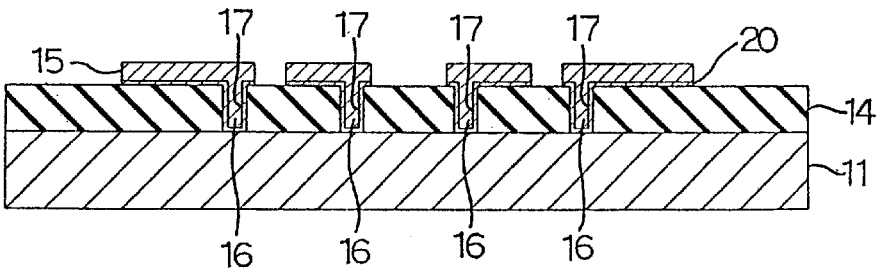

Then, the plating resist 21 is removed by a known etching process, such as a chemical etching process (wet etching), as shown in FIG. 5(d). Thereafter, the part of the ground 20 on which the plating resist 21 was formed is likewise removed by a known etching process, such as the chemical etching process (wet etching), as shown in FIG. 5(e).

In the process wherein the first conductive layer 15 to be formed in the specified circuit pattern is formed on the first insulating layer 14, the first conducting passages 16 in the first via holes 17 and the first conductive layer 15 can be formed in the single step via the electrolysis plating as mentioned above, but the forming of the first conductive layer 15 and the forming of the first conducting passages 16 need not necessarily be formed in the single step. For example, the semi-additive process may alternatively be used to form the first conductive layer 15, according to which with the support board 11 as the cathode, the first conducting passages 16 are formed by plating, first, and then the ground 20 is formed on the first conducting passages 16.

Then, as shown in FIG. 3(*c*), the second insulating layer 23 having the second via holes 22 is formed on the first conductive layer 15 as was formed in the specified circuit pattern. The second insulating layer 23 can be formed by use of the same resin as that of the first insulating layer 14 in the same manner.

For example, when the second insulating layer 23 is formed by use of photosensitive polyimide resin, it is preferably formed in the negative type pattern, as is the case with the forming of the first insulating layer 14. Specifically, the photosensitive polyamic acid resin layer 23P is formed on the first conductive layer 15, first, as shown in FIG. 6(*a*). Then, after the photomask 24 is set in position on the polyamic acid resin layer 23P to face the position for the second via holes 22 to be made larger in pitch than the first via holes 17, as shown in FIG. 6(*b*), the polyamic acid resin layer 23P is irradiated with irradiated radiation through the photomask 24. Sequentially, the polyamic acid resin layer is heated at a specified temperature to form the negative type pattern and then is developed through the specified developing procedure. As a result of this, as shown in FIG. 6(*c*), the unexposed part of the photosensitive polyamic acid resin layer 23P or the part masked by the photomask 24 is dissolved in the developing solution to thereby form the second via holes 22.

Then, the polyamic acid resin layer 23P having the second via holes 22 formed therein is finally heated, for example, to 250° C. or more to be cured (imidized) and thereby the second insulating layer 23 of polyimide is formed, as shown in FIG. 6 (*d*).

Sequentially, the second conductive layer 25 formed in the specified circuit pattern is formed on the second insulating layer 23 thus formed, as illustrated in FIG. 3(*d*). The second conductive layer 25 can be formed by use of the same metal as that of the first conductive layer 15 in the same manner.

Specifically, the second conductive layer 25 is preferably formed by the semi-additive process. As shown in FIG. 7(*a*), a thin film of conductive material that is to form a ground 26 is formed on the entire front surface of the second insulating layer 23 and the side walls and bottom wall in each of the second via holes 22, first. Then, a plating resist 27 is formed on the ground 26 at part thereof other than the part for the specified circuit pattern to be formed, as shown in FIG. 7(*b*). Thereafter, as shown in FIG. 7(*c*), metal is deposited in the second via holes 22 by the electrolysis plating to form the second conducting passages 28. Then, the electrolysis plating continues, via which the metal is deposited on the second insulating layer 23 at part thereof where the plating resist 27 is not formed, so as to form the second conductive layer 25 in the specified circuit pattern. Then, the plating resist 27 is removed by a known etching process, such as the chemical etching process (wet etching), as shown in FIG. 7(*d*). Thereafter, the part of the ground 26 on which the plating resist 27 was formed is likewise removed by the known etching process, such as the chemical etching process (wet etching), as shown in FIG. 7(*e*).

Then, as shown in FIG. 3(*e*), the third insulating layer 30 having the third via holes 29 is formed on the second conductive layer 25 as was formed in the specified circuit pattern. The third insulating layer 30 can be formed by use of the same resin as that of the second insulating layer 23 in the same manner. Preferably, the third insulating layer 30 has adhesion properties (thermal fusion bonding properties) for adhesion (thermally fusion bonding) to the multilayer circuit board 13 as it stands. For this reason, a photosensitive resin having adhesion properties is preferable. Among others, a photosensitive polyimide resin having adhesion properties, as well as the melting viscosity after imidized (250°C.) of 1,000–1000,000 Pa·S, or preferably 5,000–500,000 Pa·S and the glass transition temperature (Tg) of 50–250° C., or preferably 100–200° C., is of preferable.

For example, when the third insulating layer 30 is formed by use of photosensitive polyimide resin, it is preferably formed in the negative type pattern, as is the case with the forming of the second insulating layer 23. Specifically, a photosensitive polyamic acid resin layer 30P is formed on the second conductive layer 25, first, as shown in FIG. 8(*a*). Then, after the photomask 31 is set in position on the polyamic acid resin layer 30P to face the position for the third via holes to be made larger in pitch than the second via holes 22 and also correspond in position to the terminals 33 of the multilayer circuit board 13 mentioned later (See FIG. 2), as shown in FIG. 8(*b*), the photosensitive polyamic acid resin layer 30P is irradiated with irradiated radiation through the photomask 31 sequentially, the polyamic acid resin layer is heated at a specified temperature to form the negative type pattern and then is developed through the specified developing procedure. As a result of this, as shown in FIG. 8(*c*), the unexposed part of the photosensitive polyamic acid resin layer 30P or the part masked by the photomask 31 is dissolved in the developing solution to thereby form the third via holes 29.

Then, the polyamic acid resin layer 30P having the third via holes 29 formed therein is finally heated, for example, to 250° C. or more to be cured (imidized) and thereby the third insulating layer 30 of photosensitive polyimide is formed, as shown in FIG. 8(*d*).

Thus, the multilayer interposer 12 having the first conductive layer 15 and the second conductive layer 25 formed on the support board 11 is formed.

Then, terminals 32 are formed in the third via holes 29 of the interposer 12 by a known manner, e.g., by plating it with gold, copper or solder, as shown in FIG. 3(*f*), for joining to terminals 33 of a multilayer circuit board 13 as will be mentioned later.

In this method, the multilayer circuit board 13 is formed separately from the interposer 12, as shown in FIG. 1(*b*). The multilayer circuit board 13 may be formed by any known method, though it is preferably formed by the processes shown in FIGS. 9 and 10 in the illustrated embodiment. Taking the steps shown in FIGS. 9 and 10 as an example, the steps for forming the multilayer circuit board 13 is described in detail.

To form the multilayer circuit board 13, an insulation board 34 of prepreg is prepared, first, as shown in FIG. 9(*a*). Then, via holes 35 are formed in the insulation board 34. The prepregs of the insulation board 34 which may preferably be used include, for example, known prepregs used as the insulating material of the multilayer circuit board, such as aramid-epoxy composite, glass-epoxy composite, glass-BT resin composite, and aramid-BT composite. The thickness of the prepreg is not limited to any particular thickness, though its adequate thickness is e.g. around 50–300 μm. The via holes 35 may be formed by a known method such as a drilling, a laser processing and the like.

Then, conductive paste 36 is filled in the via holes 35, as shown in FIG. 9(*b*). The conductive paste 36 can be filled, for example, by the printing process wherein a mold releasing sheet is adhesive bonded to the insulation board 34 and is used as the mask for use in the printing process. Thereafter, the metal foils 38 are arranged on both sides of the insulation board 34, respectively, as shown in FIG. 9(c), and then are heated and pressurized. As a result of this, the insulation board 34 of prepreg and the conductive paste 36 are cured and simultaneously the metal foils 38 are adhesive bonded to the insulation board 34. The metal foils 38 which may preferably be used include, for example, a copper foil. The thickness of each metal foil 38 is not limited to any particular thickness, though its adequate thickness is e.g. around 5–30 μm.

Figure 9C:
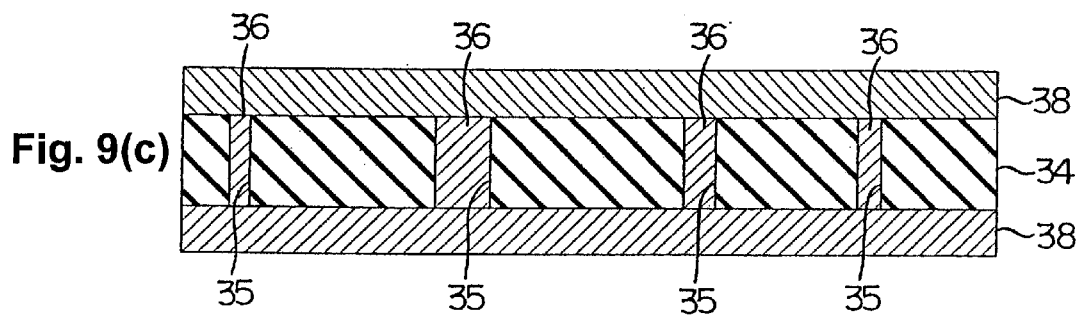
Figure 9D:
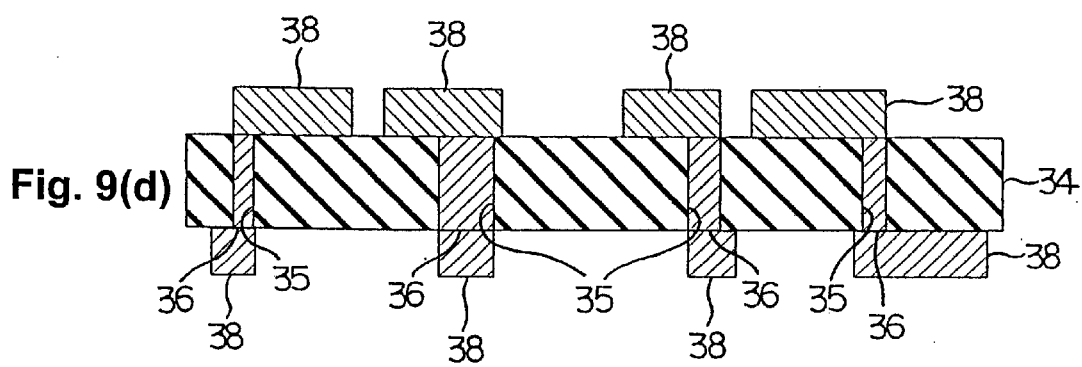

Then, the metal foils 38 are formed in a specified circuit pattern by patterning using a known method such as photo lithography, as shown in FIG. 9(d).

Figure 10E:
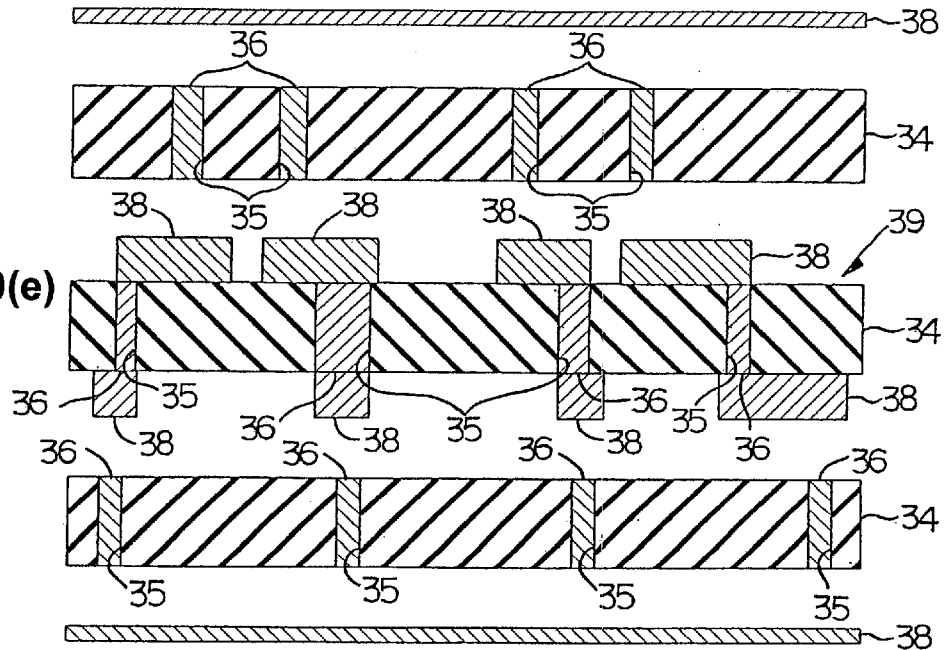
Figure 10F:
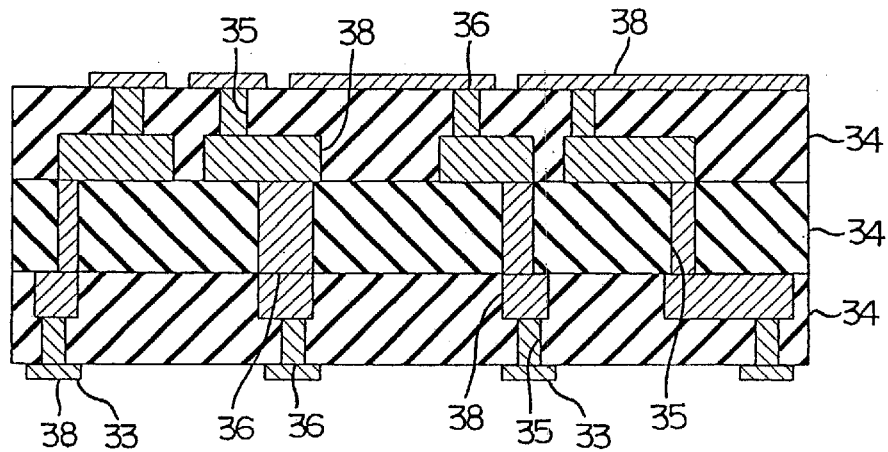

Then, the insulation boards 34 of prepreg, which have the via holes 35 filled with the conductive paste 36 in the step of FIG. 9(b) (the via holes 35 in the insulation boards 34 are different in position of the via holes 35 from each other), are arranged on both sides of the both-side wiring board 39 thus obtained which are used as the core. Also, the metal foils 38 are arranged on both outer sides of the insulation boards 34 of the prepreg, respectively. Then, they are heated and pressurized, as shown in FIG. 10(e), so that the external insulation boards 34 of prepreg and the conductive paste 36 are cured, as is the case with the above, and simultaneously the external metal foils 38 are adhesive bonded to the insulation boards 34. Then, the external metal foils 38 are formed in a specified circuit pattern by patterning using a known method such as photo lithography, as shown in FIG. 10(f), to thereby produce the maltilayer circuit board 13. It should be noted in FIG. 10(f) that the lower metal foil 38 of the multilayer circuit board 13 is formed in the form of terminals 33 to be connected to the interposer 12.

Figure 11A:
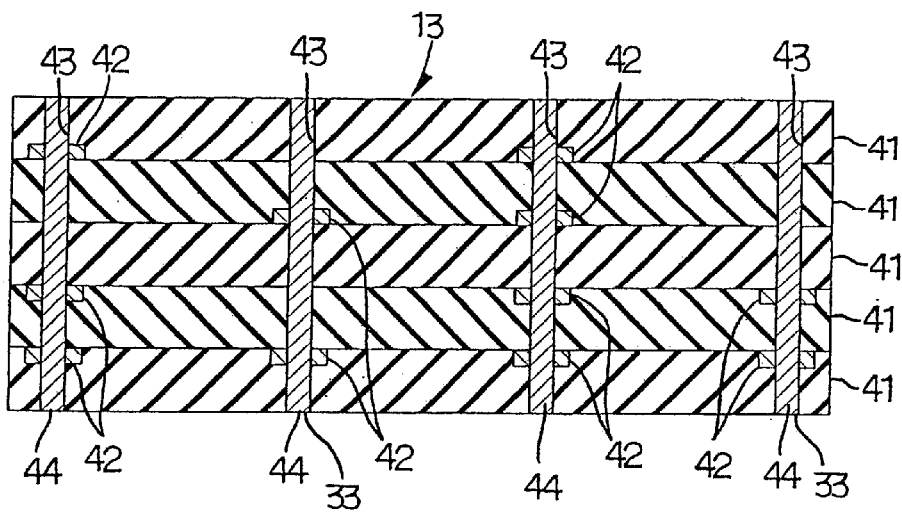

The multilayer circuit board 13 may be formed in the following process, as shown, for example, in FIG. 11(a). Conductive layers 42 of conductive metal are formed in the specified circuit pattern on both sides of the said insulating layer 41 of the insulative resin film by using any known patterning process, such as the subtractive process, the additive process or the semi-additive process. Further, after the insulating layer 41 and the conductive layer 42 are alternately formed on the both sides of the conductive layers 42, through holes 43 are formed therein by a known method such as a drilling, a laser processing and the like. Then, the plating or the conductive paste is filled in the through holes 43 to thereby form the conducting passages 44. In this variant, the through holes 43 may be formed after all insulating layers 41 and the conductive layers 42 are laminated, as mentioned above, but they may be formed in advance in each layer to be laminated on one another. The forming of the through holes in each layer can produce densification of multilayer circuit board 13. In this multilayer circuit board 13, the conducting passages 44 at one end thereof are formed as the terminals 33 for connection to the interposer 12.

Figure 11B:
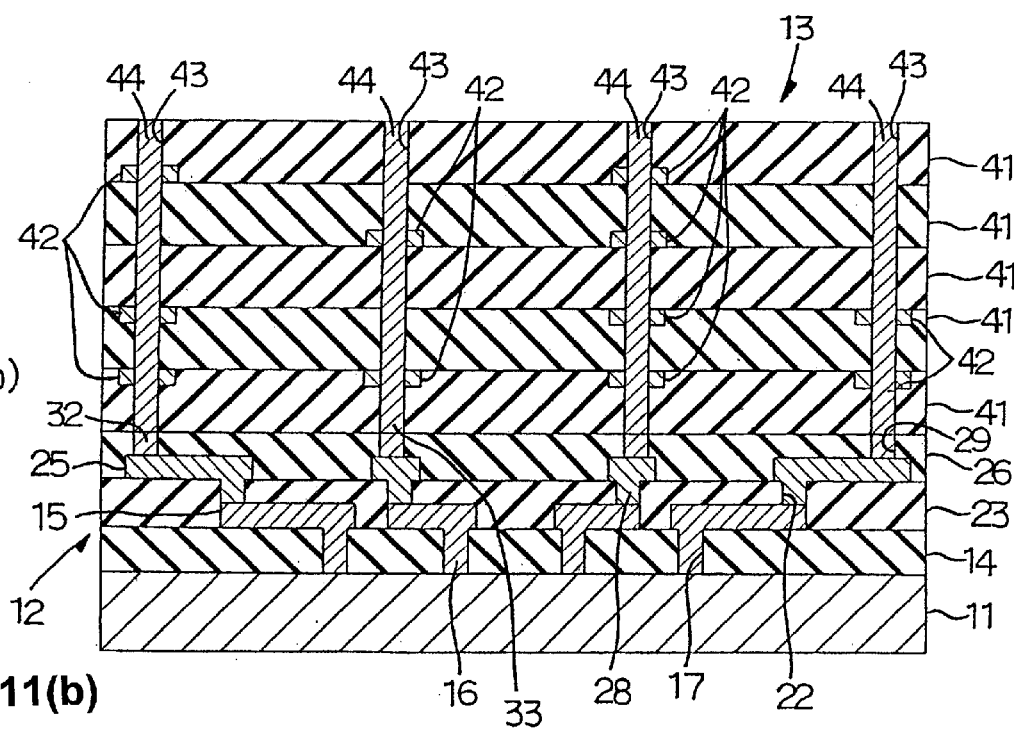

In this method, the interposer 12 formed on the support board 11 and the multilayer circuit board 13 thus produced are joined together, as shown in FIG. 1(c) and FIG. 11(b).

The joining of the interposer 12 and the multilayer circuit board 13 may be effected by a known manner such as adhesive bonding using an adhesive agent. Preferably, the third insulating layer 30 of the interposer 12 is formed by using polyimide having adhesive properties so that the interposer 12 and the multilayer circuit board 13 can be joined together by hot pressing, without any adhesive agent. The hot pressing is preferably performed under conditions of heating temperature of 150–300° C., or preferably 200–250° C.; pressure of $1\times10^4$–$1\times10^6$ Pa, or preferably $5\times10^4$–$3\times10^5$ Pa; and for 5 second to 60 minutes, or preferably 1–minutes. The joining is performed in the state in which the terminals 32 of the interposer 12 and the terminals 33 of the multilayer circuit board 13 are so positioned as to contact with each other.

Figure 12C:
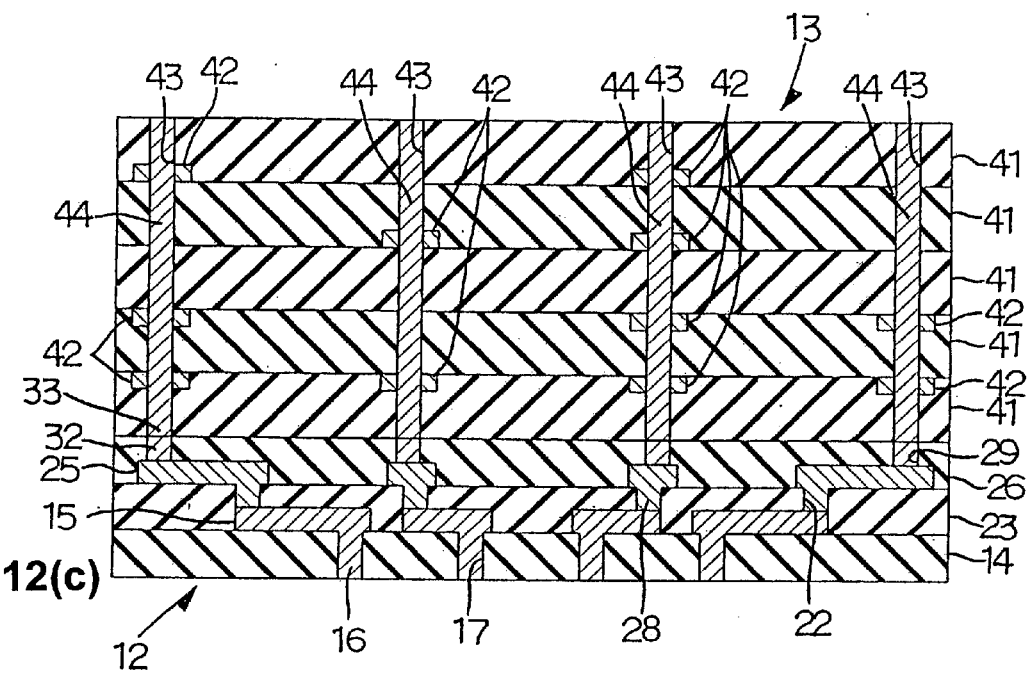

Then, in this method, the support board 11 forming thereon the interposer 12 is removed, as shown in FIG. 2(b) and FIG. 12(c).

The removal of the support board 11 can be done by a known etching process, such as the chemical etching process (wet etching). In the removal process of the support board 11, the support board 11 may all be removed off or may partially be left for use as the circuit pattern or reinforced layer.

Figure 2D:
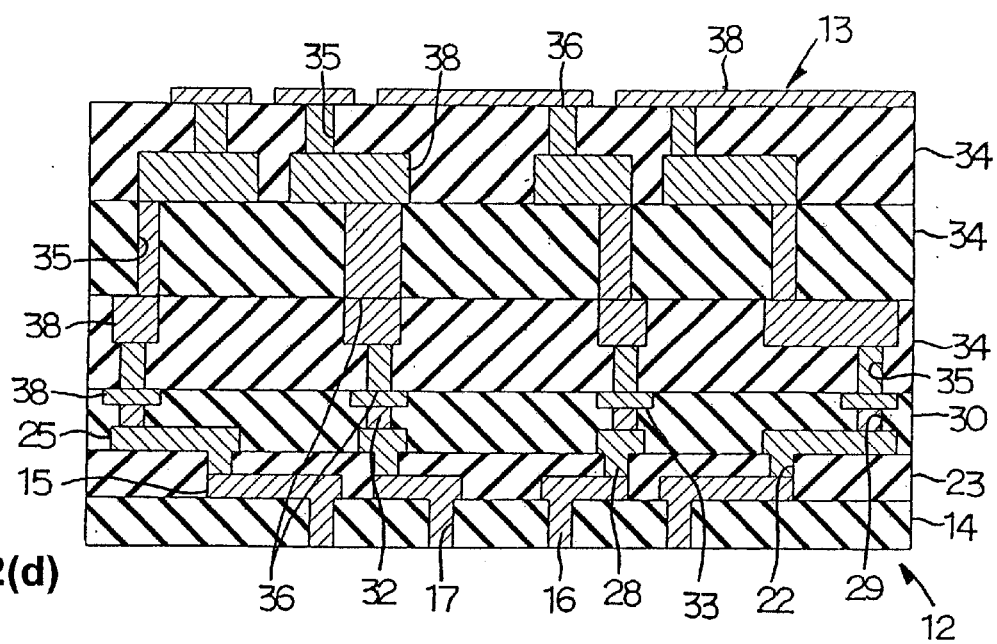
FIG. 2 is a process drawing showing the embodiment of the producing method of multilayer circuit board of the present invention, wherein:
(d) is a sectional view illustrating the step of removing the support board; and
(e) is a sectional view illustrating the step of mounting a semiconductor device chip on the interposer.
Figure 2E:
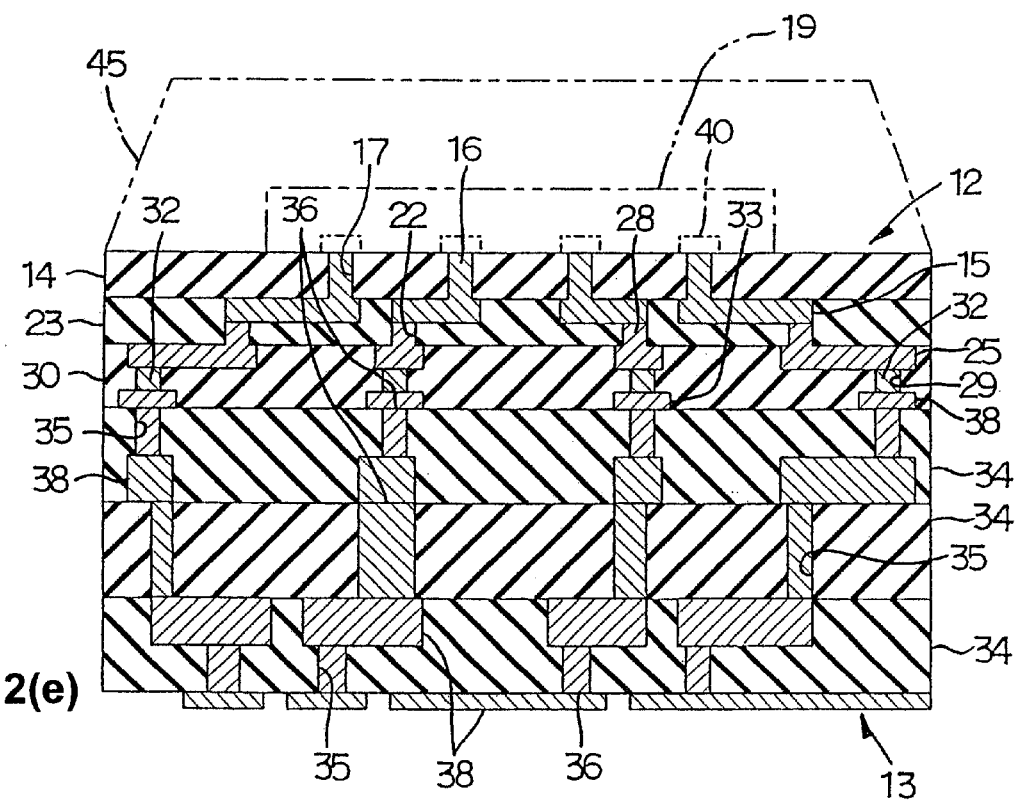
Figure 12D:
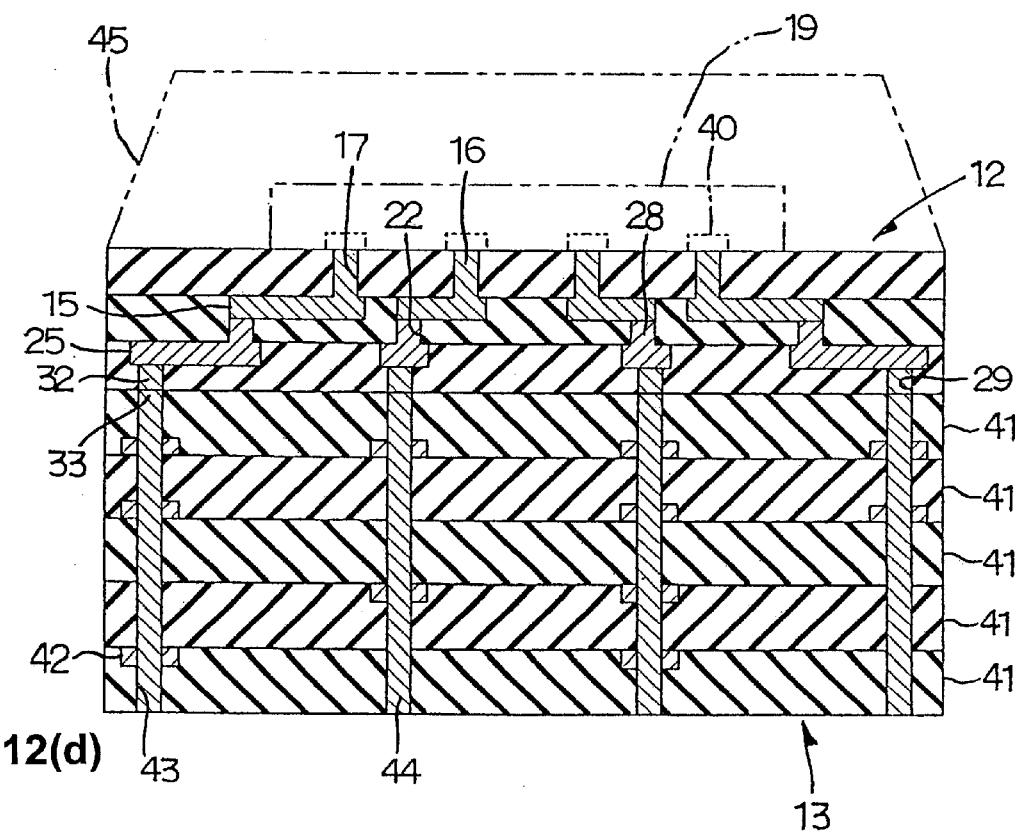

After the removal of the support board 11, the terminals 40 of the semiconductor chip 19 are connected to the first conducting passages 16 of the first insulating layer 14, as shown in FIG. 2(e) and FIG. 12(d), for example, and thereby the semiconductor chip 19 can be mounted, keeping its original size been substantially unchanged. The semiconductor chip 19 is usually sealed by sealing material 45.

According to this method for producing the multilayer circuit board 13 having the interposer 12, the interposer 12 and the multilayer circuit board 13 can be allowed to be produced separately. Hence, even if the production of the interposer 12 fails after the production of the multilayer circuit board 13, it is possible to scrap the interposer 12 only and there is no need to scrap it together with the multilayer circuit board 13, differently from the conventional method. Thus, losses in the manufacturing process can be reduced, thus achieving saving of material resources and reduction of manufacturing costs.

Besides, although the interposer 12 is so thin and limp, since it is formed on the support board 11, the terminals 32 of the interposer 12 and the terminals 33 of the multilayer circuit board 13 can surely and easily be positioned relative to each other when the interposer 12 and the multilayer circuit board 13 are joined together. Hence, according to this method, the interposer 12 can surely be mounted on the multilayer circuit board 13.

In addition, according to this method, since the support board 11 serves to prevent contraction of the resin of the insulating layers in the manufacturing process of the interposer 12, the displacement between the layers can well be prevented. Hence, the interposer 12 can be produced with fine pitches with accuracy, as compared with the conventional method that after the multilayer circuit board is produced, the interposer is produced directly on it.

Further, according to this method, since the support board 11 enables the connecting surface of the semiconductor chip 19 on the first insulating layer 14 to smoothly be formed, improved reliability for connection with the semiconductor chip 19 can be provided.

While in the description above, the interposer 12 is formed in the multilayer, no limitation is imposed on the number of layers. However, the interposer 12 formed in the multilayer can provide the advantage of enabling the connection to the terminals 40 of the semiconductor chip 19 formed with finer pitches. Also, no limitation is imposed on the number of multilayer circuit board 13, as is the case with the interposer 12.

While in the description above, the terminals 33 are formed on only either side of the multilayer circuit board 13, on the either side of which the interposer 12 is joined, the terminals 33 may be formed, for example, on both sides of the multilayer circuit board 13, on each side of which the interposer 12 may be formed. Further, the terminals 33 may be formed on both sides of the multilayer circuit board 13, to one side of which the interposer 12 is joined and to the other side of which another multilayer circuit board 13 is joined. In the case where a further multilayer circuit board 13 is joined to the other side of it, either an identical type of multilayer circuit board 13 or a different type of multilayer circuit board 13 may be used. For example, either the multilayer circuit board 13 of the type shown in FIG. 1(b) or the multilayer circuit board 13 of the type shown in FIG. 11(a) can then be used.

While in the description above, the producing method of the multilayer circuit board of the present invention has been described, taking the producing method of the multilayer circuit board 13 having the interposer 12 as the example, the circuit board to be joined to the multilayer circuit board is not limited to the interposer, but any selected circuit board for intended purposes and applications can be joined to the multilayer circuit board.

EXAMPLES

While in the following, the present invention will be described in further detail with reference to Examples, the present invention is not limited to any Examples. Also, the diagrams referred are just for the purpose of showing the steps of the procedure and are not intended to depict the size with accuracy.

Manufacturing Example 1

Production of Interposer A

First, a SUS plate having thickness of 25 μm was used as the support board 11, and photosensitive polyamic acid resin comprising the following composition was applied on the support board 11, as shown in FIG. 4(a). Then, it was dried at 100° C. for 20 minutes to thereby produce the polyamic acid resin layer 14P to be formed as the first insulating layer.

Composition of Polyamic Acid Resin of First Insulating Layer

Component of acid dianhydride: 3, 3', 4, 4'-biphenyl tetracarboxylic acid dianhydride (1.0 mol);

Component of Diamine: p-phenylene diamine (0.9 mol), and 4, 4'-diamino diphenyl ether (0.1 mol);

Photosensitizer: 1-ethyl-3,5-dimethoxycarbonyl-4-(2-nitrophenyl)-1,4-dihydropyridine (0.26 mol); and Organic solvent: N-methyl-2-pyrrolidone Sequentially, the polyamic acid resin layer 14P was irradiated with irradiated radiation for exposure (g ray) through the photomask 18, as shown in FIG. 4(b), and then was heated at 170° C. for 3 minutes and then developed by using alkaline developer, whereby the first via holes 17 were formed at positions corresponding to the terminals 40 of the semiconductor chip 19, as shown in FIG. 4(c). Thereafter, it was heated at 400° C. for 30 minutes to be cured (imidized), to thereby form the first insulating layer 14 of polyimide having thickness of 10 μm, as shown in FIG. 4(d).

Then, a thin chrome film having thickness of about 300 Å and a thin copper film having thickness of about 1,000 Å formed on the chrome film were formed as the ground 20 on the entire surface of the first insulating layer 14 and the side walls of the bottom wall in each of the first via holes 17 by the sputtering deposition, as shown in FIG. 5(a). Thereafter, the plating resist 21 was formed on the ground 20 in the part thereof other than the part for the specified circuit pattern to be formed, as shown in FIG. 5(b). Thereafter, as shown in FIG. 5(c), with the support board 11 as the cathode, metal was deposited in the first via holes 17 by the electrolysis plating, to form the first conducting passages 16. Then, the electrolysis plating continues, via which the metal was deposited on the first insulating layer 14 in the part thereof where the plating resist 21 was not formed, so as to form the first conductive layer 15 in the specified circuit pattern. Then, after the plating resist 21 was removed by using alkaline etching solution, as shown in FIG. 5(d), the ground 20 on which the plating resist 21 had been formed was also removed by using the alkaline etching solution, as shown in FIG. 5(e).

Then, photosensitive polyamic acid resin having the following composition was applied on the first conductive layer 15 formed in the specified circuit pattern and then dried at 100° C. for 20 minutes to thereby form the polyamic acid resin layer 23p to be formed as the second insulating layer, as shown in FIG. 6(a).

Composition of Polyamic Acid Resin of Second Insulating Layer

Component of acid dianhydride: 3, 3', 4, 4'-biphenyl tetracarboxylic acid dianhydride (1.0 mol);

Component of Diamine: p-phenylene diamine (0.9 mol), and 4, 4'-diamino diphenyl ether (0.1 mol);

Photosensitizer: 1-ethyl-3,5-dimethoxycarbonyl-4-(2-nitrophenyl)-1,4-dihydropyridine (0.26 mol); and Organic solvent: N-methyl-2-pyrrolidone Sequentially, the polyamic acid resin layer 23p was irradiated with irradiated radiation for exposure (g ray) through the photomask 24, as shown in FIG. 6(b), and then was heated at 170° C. for 3 minutes and then developed by using alkaline developer, whereby the second via holes 22 were formed to have pitches larger than those of the first via holes 17. Thereafter, it was heated at 400° C. for 30 minutes to be cured (imidized), to thereby form the second insulating layer 23 of polyimide having thickness of 10 μm, as shown in FIG. 6(d).

Figures 7A, 7B, 7C, 7D, 7E:
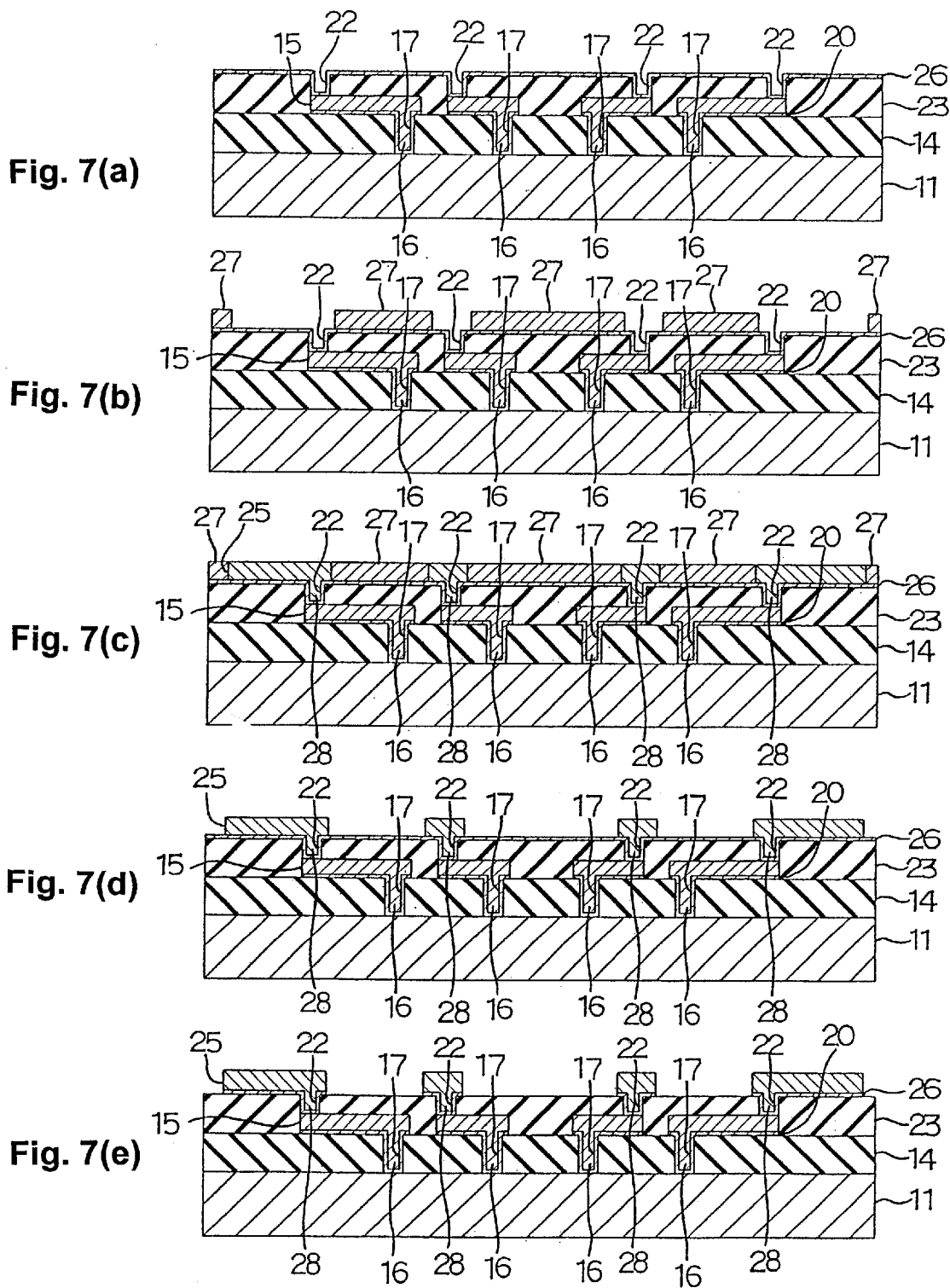

Then, a thin chrome film having thickness of about 300 Å and a thin copper film having thickness of about 1,000 Å formed on the chrome film were formed as the ground 26 on the entire surface of the second insulating layer 23 and the side walls of the bottom wall in each of the second via holes 22 by the sputtering deposition, as shown in FIG. 7(a). Thereafter, the plating resist 27 was formed in the part thereof other than the part for the specified circuit pattern to be formed, as shown in FIG. 7(b). Thereafter, as shown in FIG. 7(c), metal was deposited in the second via holes 22 by the electrolysis plating, to form the second conducting passages 28. Then, the electrolysis plating continues, via which the metal was deposited on the second insulating layer 23 in the part thereof where the plating resist 27 was not formed, so as to form the second conductive layer 25 in the specified circuit pattern. Then, after the plating resist 27 was removed by using alkaline etching solution, as shown in FIG. 7(d), the ground 26 on which the plating resist 27 had been formed was also removed by using the alkaline etching solution, as shown in FIG. 7(e).

Then, photosensitive polyamic acid resin having the following composition was applied on the second conductive layer 25 formed in the specified circuit pattern and then dried at 100° C. for 20 minutes to thereby form the polyamic acid resin layer 30p to be formed as the third insulating layer, as shown in FIG. 8(a).

Composition of Polyamic Acid Resin of Third Insulating Layer

Component of acid dianhydride: 3, 3', 4, 4'-oxydiphthalic acid dianhydride (1.0 mol);

Component of Diamine: 1, 3-bis (3-aminophenoxy) benzene (0.7 mol), bisamino propyl tetramethyldisiloxane (0.3 mol);

Photosensitizer: 1-ethyl-3,5-dimethoxycarbonyl-4-(2-nitrophenyl)-1,4-dihydropyridine (0.26 mol); and Organic solvent: N-methyl-2-pyrrolidone Sequentially, the polyamic acid resin layer 30p was irradiated with irradiated radiation for exposure (i ray) through the photomask 31, as shown in FIG. 8(b), and then was heated at 170° C. for 3 minutes and then developed by using alkaline developer, whereby the third via holes 29 were formed at positions corresponding to the terminals 33 of the multilayer circuit board 13, as shown in FIG. 8(c). Thereafter, it was heated at 300° C. for 30 minutes to be cured (imidized), to thereby form the third insulating layer 30 of polyimide having thickness of 10 μm, as shown in FIG. 8(d).

Then, the terminals 32 were formed by gold plating in the third via holes 29, as shown in FIG. 3(f), to thereby produce the interposer A, as shown in FIG. 3(f).

In the interposer A thus produced, the first via holes 17 in the first insulating layer 14 have a bore diameter of 50 μm and an interval between the first via holes 17 of 50 μm, and the third via holes 29 in the third insulating layer 30 have a bore diameter of 60 μm and an interval between the third via holes 29 of 70 μm.

Manufacturing Example 2

Production of Multilayer Circuit Board A

The insulation board 34 of prepreg of aramide-epoxy composite having thickness of 100 μm was prepared, first, as shown in FIG. 9(a). Then, the via holes 35 were formed in the insulation board by the laser processing. Then, after the conductive paste 36 was filled in the via holes 35 by screen printing method, as shown in FIG. 9(b), the metal foils 38 having thickness of 18 μm were arranged on both sides of the insulation board 34, respectively, as shown in FIG. 9(c), and then were heated and pressurized, so that the insulation board 34 of prepreg and the conductive paste 36 were cured and simultaneously the metal foils 38 were adhesive bonded to the insulation board 34. Then, the metal foils 38 were formed in the specified circuit pattern by patterning using a known method such as photo lithography, as shown in FIG. 9(d). Then, the insulation boards 34 of prepreg having the via holes 35 filled with the conductive paste 36 formed in the step of FIG. 9(b) (the via holes 35 in the insulation boards 34 are different in position from each other) were arranged on both sides of the both-side wiring board 39 and the metal foils 38 were arranged on both outer sides of the insulation boards 34 of the prepreg, respectively. Then, they were heated and pressurized, so that the external insulation boards 34 of prepreg and the conductive paste 36 were cured, as is the case with the above, and simultaneously the external metal foils 38 were adhesive bonded to the insulation boards 34, as shown in FIG. 10(e). Then, the external metal foils 38 were formed in the specified circuit pattern by patterning using a known method such as photo lithography, as shown in FIG. 10(f), to thereby produce the multilayer circuit board A.

Manufacturing Example 3

Production of Multilayer Circuit Board B

Conductive layers 42 of copper foil having thickness of 18 μm were adhesive bonded to both sides of the insulating layer 41 of polyimide film having thickness of 25 μm through the polyimide-base adhesive agent of 15 μm in thickness and were formed in the specified circuit pattern by using the subtractive process. Further, the same insulating layers 41 were adhesive bonded to the both sides of the conductive layers 42 through the same adhesive agent, and the same conductive layers 42 were adhesive bonded to the both sides of the insulating layers 41 through the same adhesive agent and were formed in the specified circuit pattern by using the subtractive process. Further, after the same insulating layers 41 were adhesive bonded to the both sides of the conductive layers 42 through the same adhesive agent, the through holes 43 having the bore diameter of 150 μm were formed therein by the drilling. Then, the plating paste was filled in the through holes 43 to thereby form the conducting passages 44. Thus, the multilayer circuit board B shown in FIG. 11(a) was formed.

Example 1

As shown in FIG. 1(c), with the third insulating layer 30 of the interposer A and the outermost metal foil 38 of the multilayer circuit board A confronting each other, the interposer A produced in the manufacturing example 1 and the multilayer circuit board A produced in the manufacturing example 2 were press-contacted with each other by heating at 250° C. and 2×10⁶ Pa for 10 seconds. Thereafter, as shown in FIG. 2(d), the support board 11 was removed by etching to thereby produce the multilayer circuit board A having the interposer A.

Example 2

As shown in FIG. 11(b), with the third insulating layer 30 of the interposer A and the outermost insulating layer 41 of the multilayer circuit board B confronting each other, the interposer A produced in the manufacturing example 1 and the multilayer circuit board B produced in the manufacturing example 3 were press-contacted with each other by heating at 250° C. and 2×10⁶ Pa for 10 seconds. Thereafter, as shown in FIG. 12(c), the support board 11 was removed by etching to thereby produce the multilayer circuit board B having the interposer A.

While the illustrative embodiments of the present invention are provided in the above description, such is for illustrative purpose only and it is not to be construed restrictively. Modifications and variations of the present invention that will be obvious to those skilled in the art are to be covered by the following claims.

What is claimed is:

1. A method for producing a multilayer circuit board which is adapted to have a semiconductor device electrically connected thereto, said method comprising:

forming on a support board, as a first component of the multilayer circuit board, a multilayered interposer for providing an electrical connection between the semiconductor device and an intermediate multilayer circuit board, the multilayered interposer having first and second sides, the first side being adjacent the support board and being formed with terminals having pitches which correspond to pitches of terminals of the semiconductor device and the second side being formed with terminals having pitches which correspond to pitches of terminals of the intermediate multilayer circuit board, the pitches of the terminals of said second side being larger than the pitches of the terminals formed on the first side;

forming, as a separate second component of the multilayer circuit board, the intermediate multilayer circuit board;

joining said multilayered interposer, to said intermediate multilayer circuit board such that the support board is facing outwardly; and removing the support board.

2. The method for producing the multilayered circuit board according to claim 1, wherein the support board has a thickness of 10~100 µm and is made of stainless steel or 42 alloy.

* * * * *